(12) United States Patent
Kita (10) Patent No.: US 7,126,252 B2
(45) Date of Patent: Oct. 24, 2006

(54) CONTROL METHOD OF PIEZOELECTRIC ACTUATOR, POSITION CONTROL EQUIPMENT, AND DISK DEVICE

(75) Inventor: Hiroyuki Kita, Kanagawa (JP)

(73) Assignee: Matsushita Electric Industrial Co., Ltd, Osaka (JP)

( * ) Notice: Subject to any disclaimer, the term of this patent is extended or adjusted under 35 U.S.C. 154(b) by 0 days.

(21) Appl. No.: 11/251,896

(22) Filed: Oct. 18, 2005

(65) Prior Publication Data

US 2006/0082254 A1      Apr. 20, 2006

(30) Foreign Application Priority Data

Oct. 20, 2004      (JP)      ............................. 2004-305457

(51) Int. Cl.
*H01L 41/09*      (2006.01)

(52) U.S. Cl. ...................................... 310/317
(58) Field of Classification Search ................ 310/317, 310/318
See application file for complete search history.

(56) References Cited

U.S. PATENT DOCUMENTS 6,556,028 B1 *   4/2003   Umanskiy et al. .......... 324/727

FOREIGN PATENT DOCUMENTS

JP      2002-288954      10/2002
JP      2003-141832      5/2003

OTHER PUBLICATIONS

Yoshikazu Soeno et al., "Piezoelectric Piggy-Back Microactuator for Hard Disk Drive", IEEE Transactions On Magnetics, vol. 35, No. 2, (Mar. 1999), pp. 983-987.

* cited by examiner

*Primary Examiner*—Darren Schuberg
*Assistant Examiner*—Derek Rosenau
(74) *Attorney, Agent, or Firm*—Wenderoth Lind & Ponack, L.L.P.

(57)      ABSTRACT

A position control device has a piezoelectric actuator, a power supply for applying voltage to the piezoelectric actuator, a position control unit, and a reverse low voltage control unit. The position control unit identifies a position control state in which position control is performed by displacing the piezoelectric actuator and a standby state that does not require the position control, and controls the position. When the position control unit identifies the standby state, the reverse low voltage control unit sets a reverse low voltage that is directed opposite to the polarization direction of the piezoelectric film and is lower than a coercive voltage and a set time during which the reverse low voltage is applied, and transmits a power supply control signal for generating the set reverse low voltage and set time to the power supply. Thus, a large displacement amount is achieved and a long lifetime can be realized.

19 Claims, 5 Drawing Sheets

CONTROL METHOD OF PIEZOELECTRIC ACTUATOR, POSITION CONTROL EQUIPMENT, AND DISK DEVICE

BACKGROUND OF THE INVENTION

1. Field of the Invention

The present invention relates to a control method for controlling displacement of a piezoelectric actuator, and more specifically to a control method capable of performing large displacements for a long time, and a position control device and disk device using this control method.

2. Background Art

When a piezoelectric element is used as an actuator, conventionally, a piezoelectric film can be electrochemically deformed by an applied voltage, its characteristic degrades, and further its function as a piezoelectric actuator can be damaged. This degradation is apt to occur especially when the voltage applied for increasing the displacement amount is increased. For suppressing the degradation, various control methods are proposed as the driving method of the piezoelectric actuator.

As the control method of the piezoelectric actuator, Japanese Patent Unexamined Publication No. 2002-288954 discloses a method of restricting the control voltage applied to the piezoelectric actuator to a threshold or below.

Figure 7:
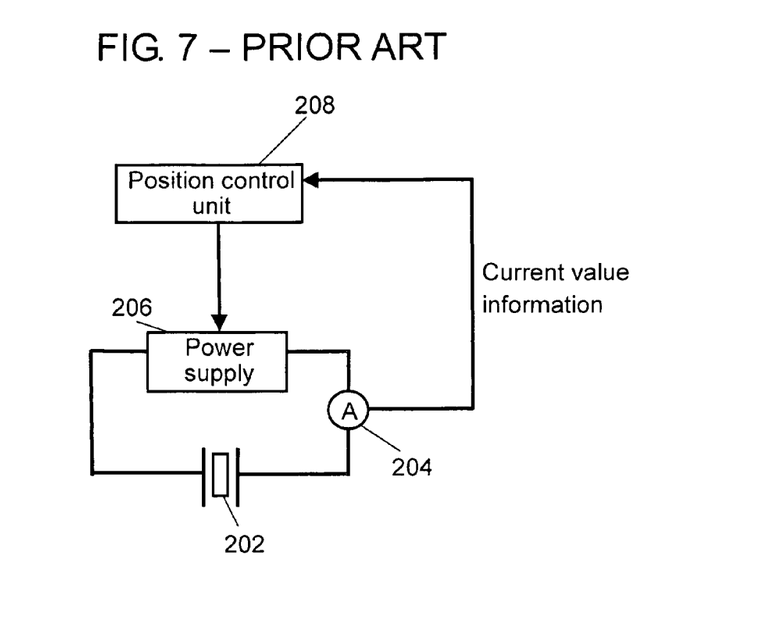
FIG. 7 is a block diagram illustrating a conventional control method.

FIG. 7 is a block diagram illustrating the disclosed control method. Piezoelectric actuator 202 is connected to power supply 206 for driving the actuator, ammeter 204, and position control unit 208. Position control unit 208 controls the voltage of power supply 206 to provide a displacement amount set in piezoelectric actuator 202. Information on the current value measured by ammeter 204 is transmitted to position control unit 208. When the control voltage that is not lower than the threshold is applied to piezoelectric actuator 202, insulation resistance of the piezoelectric film forming piezoelectric actuator 202 further degrades.

In the control method discussed above, for suppressing such degradation of the insulation resistance, the applied control voltage is restricted to the threshold or below. When the control voltage exceeds the threshold, the time period of exceeding the threshold is restricted. The threshold is set as follows:
- the threshold is set dependently on the material of the piezoelectric film; or
- the characteristic between control voltage applied to the piezoelectric actuator and the current is measured, and the control voltage at which the current increases exponentially is set as the threshold.

Japanese Patent Unexamined Publication No. 2003-141832 discloses a method in which a means for detecting the insulation resistance of the piezoelectric actuator during use is disposed, and, when the means detects the decrease in insulation resistance, the insulation resistance is recovered by applying high voltage.

Figure 8:
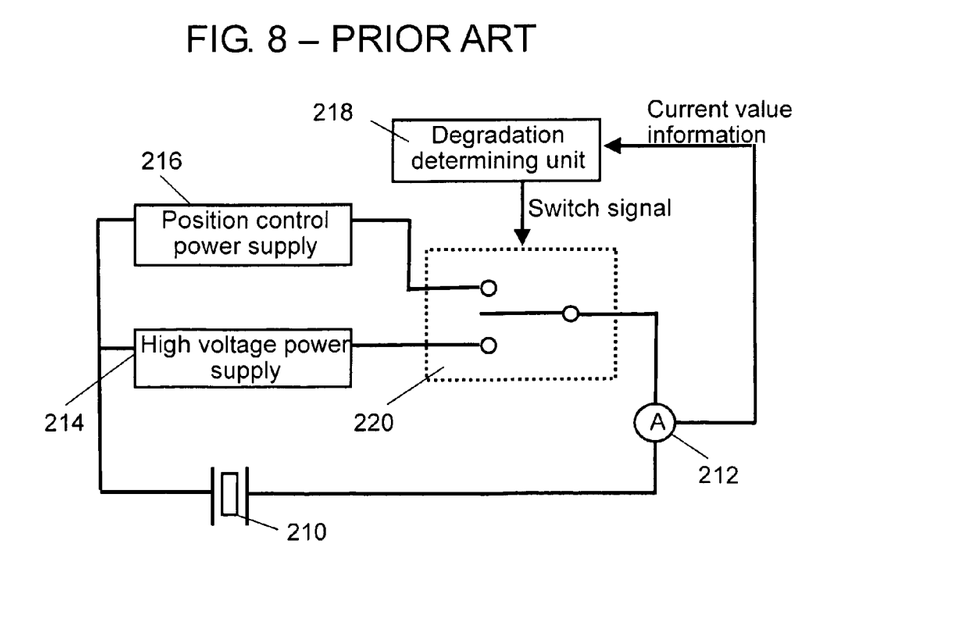
FIG. 8 is a block diagram illustrating another conventional control method.

FIG. 8 is a block diagram illustrating this control method. Piezoelectric actuator 210 has a three-layer structure where electrode films are formed on opposite sides of the piezoelectric film. Regarding the decrease in insulation resistance of piezoelectric actuator 210, generally, the resistance of the piezoelectric film does not wholly decrease, but part of the piezoelectric film often degrades locally. In such a case, high voltage is applied to the gap between the electrode films to make high current flow intensively to a part where the electric resistance is decreased by local degradation, and thus a breakdown phenomenon such as occurrence of peeling in the electrode film around the degraded part is caused. The breakdown phenomenon is used to remove the current path from a local low resistance region to recover the insulation resistance between the electrode films.

Specifically, as shown in FIG. 8, when a predetermined voltage is applied to piezoelectric actuator 210 from position control power supply 216, current flowing through piezoelectric actuator 210 is measured by ammeter 212, and current value information is fed into degradation determining unit 218. Degradation determining unit 218, based on the current value information, compares the fed current value with a preset current allowance. When this comparison indicates that the fed current value is higher than the allowance, a switch signal is fed into signal switching unit 220. By switching in signal switching unit 220, a set voltage is applied to piezoelectric actuator 210 from high voltage power supply 214. Thus, the current path can be removed from the local low resistance region as discussed above.

Another control method of a piezoelectric actuator is also shown in "IEEE (Institute of Electrical and Electronics Engineers) transactions on magnetics, vol. 35, No. 2 (1999) p. 984". In this method, the voltage applied to the piezoelectric film is not set in a range of $-X(V)$ to $+X(V)$ (X is an arbitrary positive value) (typical voltage applying method), but is set in a range of 0 to $X(V)$. In other words, the voltage range is restricted so that the voltage in the range 0 to $-X(V)$ is not applied. In this case, the applied voltage is restricted to one-side polarity such as 0 to $+X(V)$, and the applying direction is set to be the same direction as the initial polarization direction. As a result, the applied voltage is not applied in the direction opposite to the initial polarization direction. Therefore, the applied voltage does not cause inversion of the polarization, and the initial polarization is kept stable. When the initial polarization is kept stable, the displacement amount of the piezoelectric actuator is hardly reduced.

In the first control method of the piezoelectric actuator, long-term degradation of the actuator is suppressed by setting the absolute value of the control voltage at or below a certain threshold. The threshold is therefore set at a voltage value lower than the voltage value at which the piezoelectric actuator is not degraded by a short-term application. For example, the piezoelectric actuator is driven using, as the threshold, half the voltage value at which the degradation is not caused in a short time. The piezoelectric element hardly degrades, so that the lifetime is improved. The displaceable amount of the piezoelectric actuator is also restricted by the threshold voltage. Therefore, only a small displacement amount can be generated. In this conventional method, the displacement amount of the piezoelectric actuator and the lifetime are contradictory.

In the second control method of the piezoelectric actuator, the local breakdown phenomenon of the electrode film is used, so that the same desirable result cannot always be obtained. In other words, when high voltage is applied, the breakdown range of the degrading electrode film cannot be constant, namely the breakdown range can vary to be large or small. When a large area of the electrode film is broken, the area of the piezoelectric film to which the voltage is applied decreases greatly. Thus, the displacement amount of the piezoelectric actuator can greatly decrease, which is contrary to the objective of the method. The application of the high voltage can cause the piezoelectric element to dielectrically break down. When the application of the high voltage causes the electrode film to break down, dust is often generated. When the piezoelectric actuator is used for position control of the head slider of a hard disk device, for example, this generation of the dust can cause a failure of the entire hard disk device.

In the third control method of the piezoelectric actuator, the control voltage is applied completely in one direction, so that the movement of ions caused in the piezoelectric film by the control voltage is deflected in one direction. Accumulation of movement of ions disadvantageously causes the reduction of the insulation resistance.

The present invention addresses the conventional problems. The present invention provides a control method for controlling a piezoelectric actuator that can provide a large displacement amount and improve the lifetime of the piezoelectric actuator, and a position control device and disk device using the control method.

SUMMARY OF THE INVENTION

A control method for controlling a piezoelectric actuator is shown below. The piezoelectric actuator has a pair of electrode films and a piezoelectric film sandwiched between the electrode films. The piezoelectric actuator is in a position control state in which position control is performed by generating a displacement amount set by application of voltage or a standby state that does not require the position control. In the standby state, reverse low voltage that is directed opposite to the polarization direction of the piezoelectric film and is lower than the coercive voltage is applied to the piezoelectric actuator for a set time.

In this method, in the position control state, voltage is applied to the piezoelectric actuator for position control. The long-term time average of the polarity of the applied voltage deflects in the polarization direction of the piezoelectric film. In the standby state, the reverse low voltage that is directed opposite to the polarization direction of the piezoelectric film and is lower than the coercive voltage is applied. Even if the polarity of the voltage in the position control state deflects in the polarization direction of the piezoelectric film for a long time and ion migration or the like reduces insulation resistance, this reduction can be recovered by applying such reverse low voltage. As a result, a large displacement can be kept stable for a long time, and the lifetime can be elongated.

In some devices to be equipped with a position control device using the piezoelectric actuator, for example in a disk device, the position control is not always performed. In some periods, the position control is not required. Such a state may be set to be a standby state.

In at least one of the position control state and the standby state in the method discussed above, a physical property of the piezoelectric actuator may be measured and if the shift of the physical property is larger than a set value, the reverse low voltage may be applied for a set time in the standby state. In this case, the physical property may be an electrical resistance of the piezoelectric actuator.

In this method, the ion migration largely affecting the lifetime of the piezoelectric film is estimated based on the electrical resistance and the reverse low voltage is applied when the electrical resistance shifts from the set value. The reduction of the resistance can thus be efficiently recovered or suppressed.

The method discussed above may be a method in which application history information of the voltage used for controlling the position of the piezoelectric actuator is stored, the reverse low voltage and the set time are set based on the application history information, and the set reverse low voltage is applied to the piezoelectric actuator for the set time in the standby state.

In this method, the reverse low voltage and the set time are determined in response to the application history of the voltage for causing a displacing operation, so that voltage and time can be appropriately set in response to the reduction in insulation resistance due to the ion migration or the like.

In this method, the reverse low voltage and the set time set based on the application history information may be set in response to the duration of the position control state where the voltage used for controlling the position of the piezoelectric actuator is applied. They may be set in response to the time integration value of the voltage applied for controlling the position of the piezoelectric actuator or the time integration value of the function of the applied voltage and the time during which the voltage is applied. At least one of the reverse low voltage and the set time may be controlled to apply the reverse low voltage.

In such a method, the reverse low voltage can be applied in response to the voltage applied for controlling the position of the piezoelectric actuator, the occurrence of a failure can be suppressed, and the reduction in insulation resistance due to the ion migration or the like can be reliably recovered.

In this method, the piezoelectric film may be formed by a vapor deposition process or a sol-gel process, and the polarization direction of the piezoelectric film may be the film thickness direction. As the vapor deposition process, one of a sputtering method, a laser ablation method, a chemical vapor deposition (CVD) method, and a plasma chemical vapor deposition (PCVD) method may be used. Regarding the piezoelectric actuator employing such a thin film, the recovery of the insulation resistance by application of the reverse low voltage is especially effective.

A position control device has the following elements:
  a piezoelectric actuator formed of a pair of electrode films and a piezoelectric film sandwiched between the electrode films;
  a power supply for applying voltage to the piezoelectric actuator;
  a position control unit for identifying a position control state where position control is performed by displacing the piezoelectric actuator and a standby state that does not require the position control, and for controlling the position; and
  a reverse low voltage control unit that, when the position control unit identifies the standby state of the piezoelectric actuator, sets a reverse low voltage and a set time during which the reverse low voltage is applied, and transmits a power supply control signal for generating the set reverse low voltage and the set time to a power supply.

Here, the reverse low voltage is directed opposite to the polarization direction of the piezoelectric film, and is lower than the coercive voltage.

This configuration allows, by application of the reverse low voltage, recovery of reduction of the displacement amount or insulation resistance that can occur when the piezoelectric actuator is driven by the position control device. The position control equipment can be therefore used stably for a long time.

The position control equipment may further have a detecting unit for detecting a current flowing through the piezoelectric actuator and a variation calculating unit for calculating variation of the current from the initial value.

Additionally, the reverse low voltage control unit may set the reverse low voltage and set time based on the variation information from the variation calculating unit. When the position control unit is in the standby state, the reverse low voltage control unit may transmit the power supply control signal.

This configuration allows the reduction degree of the insulation resistance to be determined based on the current flowing through the piezoelectric actuator. Therefore, the reduction can be recovered by applying the reverse low voltage based on the reduction degree.

The position control device may further have an application history storage unit for storing the history of the power supply control signal. The reverse low voltage control unit may set the reverse low voltage and the set time that are to be applied to the piezoelectric actuator based on the information stored in the application history storage unit.

The reverse low voltage control unit may calculate the duration of the position control state based on the information stored in the application history storage unit, set the reverse low voltage and the set time in response to the calculated duration, and transmit a power supply control signal for generating the reverse low voltage and set time to the power supply.

The reverse low voltage control unit may calculate a time integration value of the voltage applied to the piezoelectric actuator based on the information stored in the application history storage unit, set the reverse low voltage and the set time in response to the time integration value, and transmit a power supply control signal for generating the reverse low voltage for the set time to the power supply.

The reverse low voltage control unit may calculate a time integration value of the function of the voltage applied to the piezoelectric actuator based on the information stored in the application history storage unit, set the reverse low voltage and set time in response to the time integration value of the function, and transmit a power supply control signal for generating the reverse low voltage for the set time to the power supply.

Thanks to such a configuration, the reverse low voltage corresponding to the application history or the duration of the voltage for position control can be applied to the piezoelectric actuator. Therefore, reduction in insulation resistance or displacement amount can certainly recover, and applying the reverse low voltage can prevent the piezoelectric film from degrading.

In the position control device, the piezoelectric film may be formed by a vapor deposition process or a sol-gel process, and the polarization direction may be the film thickness direction. As the vapor deposition process, one of the sputtering method, the laser ablation method, the chemical vapor deposition (CVD) method, and the plasma chemical vapor deposition (PCVD) method may be used. Regarding the piezoelectric actuator employing such a thin film, the recovery of the insulation resistance by application of the reverse low voltage can be especially effective.

A disk device of the present invention has the following elements:
 a disk on which information can be recorded;
 a head for performing at least one of recording and reproduction on the disk; and
 a position control device for controlling the position of the head on the disk.

The position control device has the following elements:
 a piezoelectric actuator formed of a pair of electrode films and a piezoelectric film sandwiched between the electrode films;
 a power supply for applying voltage to the piezoelectric actuator;
 a position control unit for identifying a position control state where position control is performed by displacing the piezoelectric actuator and a standby state that does not require the position control, and for controlling the position; and
 a reverse low voltage control unit that, when the position control unit identifies the standby state of the piezoelectric actuator, sets a reverse low voltage and a set time during which the reverse low voltage is applied, and transmits a power supply control signal for generating the set reverse low voltage for the set time to a power supply.

Here, the reverse low voltage is directed opposite to the polarization direction of the piezoelectric film, and is lower than the coercive voltage. In the position control state of the position control device, the head performs the recording or reproduction on the disk. In the standby state of the position control device, the head does not perform the recording or reproduction on the disk.

This configuration allows, without generating dust, certain recovery of reduction in insulation resistance or displacement amount that can be caused by position control in the piezoelectric actuator when the position of the head of the disk device is controlled using the piezoelectric actuator. The reliability of the disk device can therefore be largely improved.

As discussed above, in the control method of the piezoelectric actuator of the present invention, a wide range of voltage can be applied in the position control state of the piezoelectric actuator, and a wider range of position control can be performed. While, in the standby state, reverse low voltage in the direction opposite to the polarization direction is applied, so that reduction over time in insulation resistance can be suppressed. The reverse low voltage applied for suppressing the reduction in insulation resistance is restricted to a voltage within the extent in which disorder in polarization or a destructive phenomenon is not caused. Therefore, the piezoelectric actuator having both a wide position control range and a long lifetime can be obtained.

The position control device of the present invention employs the control method of the piezoelectric actuator, and the disk device of the present invention is equipped with the position control device. A time over which position control does not have to be performed is used as the standby state, and the electrical resistance reduction can be recovered by applying the reverse low voltage in this standby state. Therefore, usual use of the position control device or the disk device is not inhibited. The displacement amount can be increased, and a device of high reliability can be realized

DETAILED DESCRIPTION OF THE INVENTION

An exemplary embodiment of the present invention is described with reference to the drawings. The same elements are denoted with the same reference marks, and the descriptions of those elements are omitted.

First Embodiment

Figure 1:
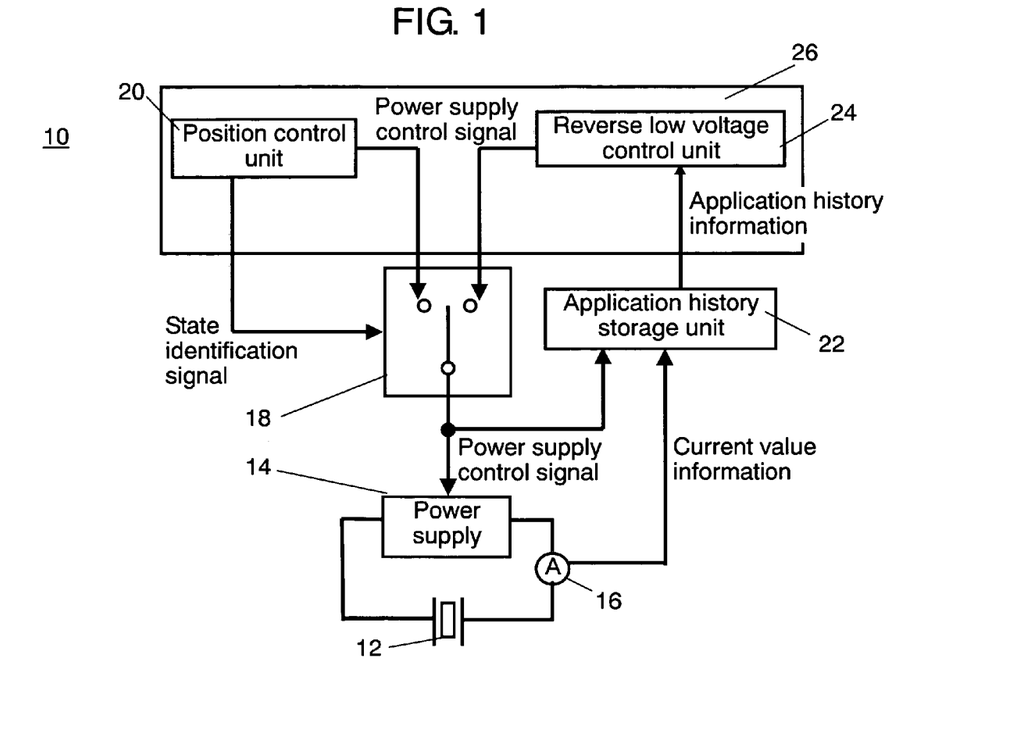
FIG. 1 is a block diagram of a position control device in accordance with an exemplary embodiment of the present invention.

FIG. 1 is a block diagram of position control device 10 in accordance with a first exemplary embodiment of the present invention. Displacement such as expansion and contraction of piezoelectric actuator 12 allows position control of a controlled object (not shown) that is mechanically connected to piezoelectric actuator 12. The displacement amount of piezoelectric actuator 12 is controlled by voltage applied from power supply 14 connected to piezoelectric actuator 12. Ammeter 16 measures current flowing through piezoelectric actuator 12.

A configuration of position control device 10 of the present exemplary embodiment and a control method for controlling the piezoelectric actuator will be described hereinafter.

The voltage applied from power supply 14 is controlled with a power supply control signal supplied from switch 18. An output source for outputting the power supply control signal depends on whether position control device 10 lies in a position control state where position control is actively performed or in a standby state where position control is not actively performed. When position control device 10 lies in the position control state, position control unit 20 supplies the power supply control signal to switch 18. Position control unit 20 sets a signal on whether or not position control unit 20 in itself actively performs the position control to be a state identification signal, and supplies the signal to switch 18. When position control device 10 lies in the standby state, reverse low voltage control unit 24 supplies the power supply control signal to switch 18.

Switch 18, based on the state identification signal, switches between a state where power supply 14 is controlled by position control unit 20 and a state where power supply 14 is controlled by reverse low voltage control unit 24. The history of the power supply control signal for controlling power supply 14 is accumulated as the application history information in application history storage unit 22, and reverse low voltage control unit 24 refers to the application history information.

In the present embodiment, position control unit 20 and reverse low voltage control unit 24 are included in signal generator 26, signal generator 26 transmits and controls a signal between position control device 10 and the other apparatus (not shown). In the present embodiment, switch 18 is disposed outside signal generator 26, but may be a part of the function of signal generator 26. Switch 18 may have a software-like configuration where it is switched electronically, or may have a hardware-like configuration where it is switched by a selector switch as shown in FIG. 1. Application history storage unit 22 is mainly formed of a memory, but may be installed as a part of signal generator 26.

Switch 18, position control unit 20, history storage unit 22 and reverse low voltage control unit 24 can be formed separately. However, the electric circuits forming these switch or units may be shared with some parts of the circuits. In addition, the programs for operating these switch or units may share some parts of the programs.

Figure 2:
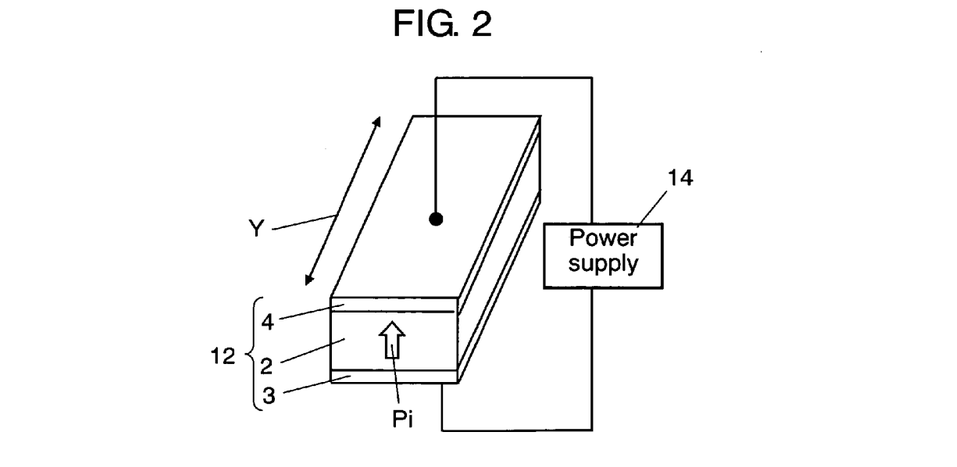
FIG. 2 is a diagram showing only the piezoelectric actuator and the power supply in FIG. 1.

Only piezoelectric actuator 12 and power supply 14 are further described with reference to FIG. 2. FIG. 2 is a diagram showing only piezoelectric actuator 12 and power supply 14 in FIG. 1. Piezoelectric actuator 12 is shown by a perspective view, and is formed of first electrode film 3, second electrode film 4, and piezoelectric film 2 having the electrode films on its opposite surfaces. First electrode film 3, second electrode film 4, and piezoelectric film 2 are formed by thin film technology such as sputtering, and are processed into the illustrated shape by photolithography and dry etching. The length of piezoelectric actuator 12 in the Y-direction, namely the longitudinal direction, is 2 mm, and the thickness thereof is about 3 μm, for example, in FIG. 2. In the actuator of FIG. 2, expansion and contraction in the Y-direction is mainly used.

For using a piezoelectric action, generally, initial polarization must be caused in piezoelectric film 2. In FIG. 2, the direction of initial polarization Pi indicated with the arrow is the thickness direction. The polarization vector does not need to be perfectly perpendicular to the film surface. When the polarization vector is inclined, only the perpendicular component is effective. The shape of piezoelectric actuator 12 does not necessarily need to be a rectangular parallelepiped shape as shown in FIG. 2. Power supply 14 for applying voltage to the gap between first electrode film 3 and second electrode film 4 is connected to piezoelectric actuator 12.

Figure 3:
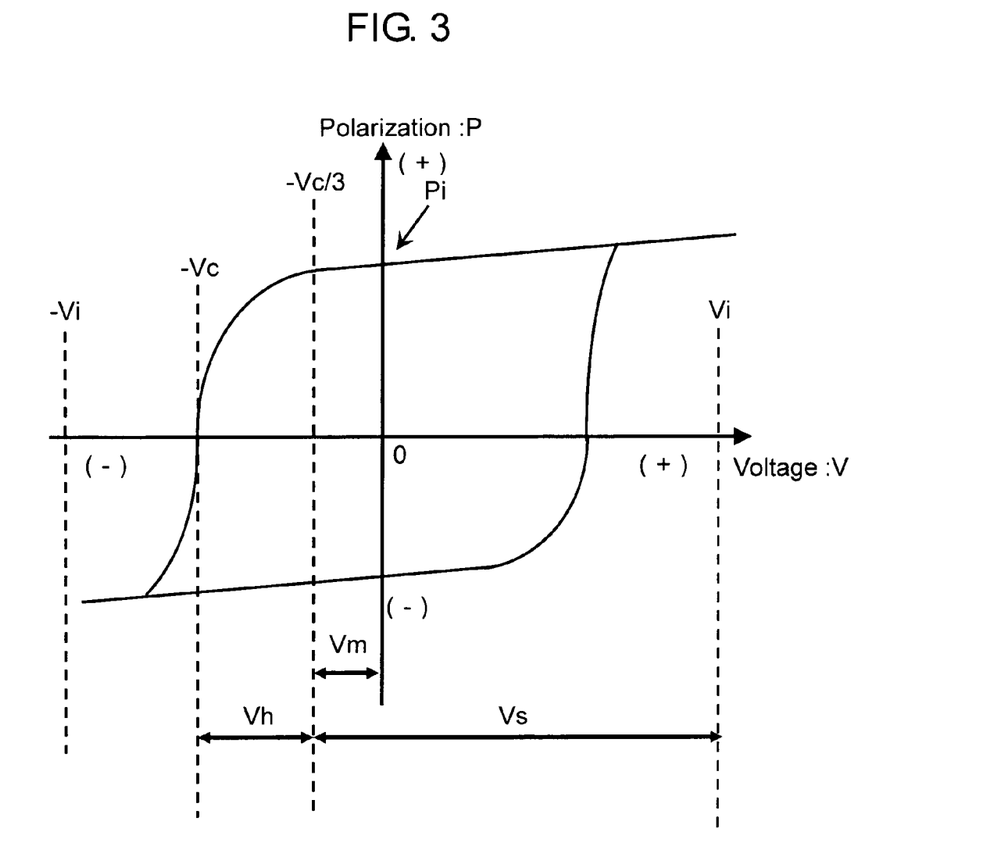
FIG. 3 is a diagram of a hysteresis loop of a relation between polarization P and voltage V of the piezoelectric actuator in accordance with the exemplary embodiment.

FIG. 3 shows a hysteresis loop of a relation between polarization P and voltage V of piezoelectric actuator 12. The vertical axis shows polarization P, and the horizontal axis shows voltage V. The direction of initial polarization Pi of piezoelectric actuator 12 shown in FIG. 2 corresponds to the positive side of the vertical axis shown in FIG. 3. When a positive voltage is applied in FIG. 3, the electric field is applied in the same direction as the arrow direction, namely the initial polarization Pi direction, shown in FIG. 2. Vc shown in FIG. 3 is called a coercive voltage or coercive electric field. The coercive voltage or coercive electric field means voltage or electric field at which the polarization disappears when a voltage −Vc having a reverse electric field is applied to piezoelectric film 2 that lies in the initial polarization Pi state shown in FIG. 2.

As an empirical rule, when voltage on the positive side with respect to the voltage of about −Vc/3 is applied as shown in FIG. 3, the polarization state is not disturbed even when a negative voltage in the direction opposite to that of initial polarization Pi is applied, and piezoelectric actuator 12 can be driven stably for a long time. When the voltage is positive, namely it is directed in the same direction as initial polarization Pi shown in FIG. 2, the polarization is stable. Therefore, the voltage value has no upper limit in the viewpoint of polarization reduction. However, piezoelectric film 2 is made of dielectric material, the upper limit of the applicable voltage value is restricted by withstand voltage Vi. In a general piezoelectric film, the absolute value of withstand voltage Vi is larger than that of coercive voltage Vc. Therefore, the range of voltage Vs allowing at least short-term stable driving of piezoelectric actuator 12 is −Vc/3<Vs<Vi. The range is deflected on the positive side of the origin (point O) of the voltage axis as shown in FIG. 3. Therefore, when the piezoelectric actuator is controlled with the utilization of the full range of Vs, the mean voltage tends to be positive.

In this state, the ion migration is apt to occur by the positive voltage, and the insulation resistance is apt to decrease. In the standby state requiring no position control, voltage Vm in the range of −Vc/3<Vm<0 is applied. This can compensate for the movement of ions by the ion migration caused in the position control state where positive voltage is substantially applied in time average. As a result, the decrease in insulation resistance in piezoelectric film 2 can be suppressed or recovered.

Applying voltage Vh in the range of −Vc<Vh<−Vc/3 can also reduce the ion migration. When voltage Vh in this range is applied, however, the polarization of piezoelectric film 2 is apt to be disturbed and become shorter than initial polarization Pi, and hence the displacement amount of piezoelectric actuator 12 is apt to decrease. Therefore, it is not preferable to apply voltage Vh in this range.

The voltage application for compensating for the case where positive voltage is applied from the viewpoint of the time average is performed simply when an apparatus equipped with position control device 10 does not require position control by position control device 10. The disk device such as a hard disk drive device has two states, namely a busy state in which information is recorded or reproduced and an idling state in which information is not being recorded or reproduced. A hard disk drive device having an indication for informing a user of the busy state, for example a light emitting diode (LED) element, is in widespread use. A signal indicating whether or not the disk device is in a busy state can be easily extracted from the disk device. In the idling state, information is not recorded or reproduced, and hence precise head position control is not required. When the head position of the disk device is controlled by position control device 10 of the present embodiment, for example, all or part of the time period of the idling state is used as the standby state, and reverse low voltage is applied. Thus, without disturbing the use of the disk device, insulation resistance caused in the piezoelectric actuator can be reduced.

A specific example of the control method of the piezoelectric actuator of the present embodiment is described hereinafter. As piezoelectric film 2 of piezoelectric actuator 12 shown in FIG. 2, a thin film that is made of lead zirconate titanate (Pb(Ti$_x$Zr$_{1-x}$)O$_3$) and has thickness of 3 μm is used. Piezoelectric film 2 is formed by the sputtering method. In first electrode film 3 and second electrode film 4, platinum (Pt) is formed by the sputtering method. These films are processed into a shape of piezoelectric actuator 12 using general technology of photolithography and dry etching. In piezoelectric actuator 12 formed in such a method, coercive voltage Vc shown in FIG. 3 is 9 V, and withstand voltage Vi is 50 V. Position control device 10 having the configuration of FIG. 1 is formed using piezoelectric actuator 12.

Position control unit 20 is programmed so as to alternately take 4-second position control states and 10-second standby states, and an examination is performed. In the position control state, signal generator 26 transmits a power supply control signal so that the voltage value from power supply 14 causes sine wave between 0 and 10 V. The polarity of the voltage at this time is set so that the electric field is directed in the same direction as the initial polarization direction.

The time integration value of the voltage applied to piezoelectric actuator 12 in the last 4 seconds is stored in application history storage unit 22. Reverse low voltage control unit 24 outputs 10% of the stored content value of application history storage unit 22 at the moment at which the state identification signal is switched from the position control state to the standby state. When the absolute value of the 10% value exceeds 3 V, the absolute value of 3 V is set as the upper limit. The upper limit of the absolute value is set at 3 V for the following reason. When coercive voltage Vc is 9 V, ⅓ of Vc is 3 V. This means when more than 3 V an as absolute value is applied opposite to the polarization direction, the polarization state of piezoelectric film 2 can be disturbed, and the piezoelectric function can decrease. The coefficient "⅓" is empirical.

Figure 4:
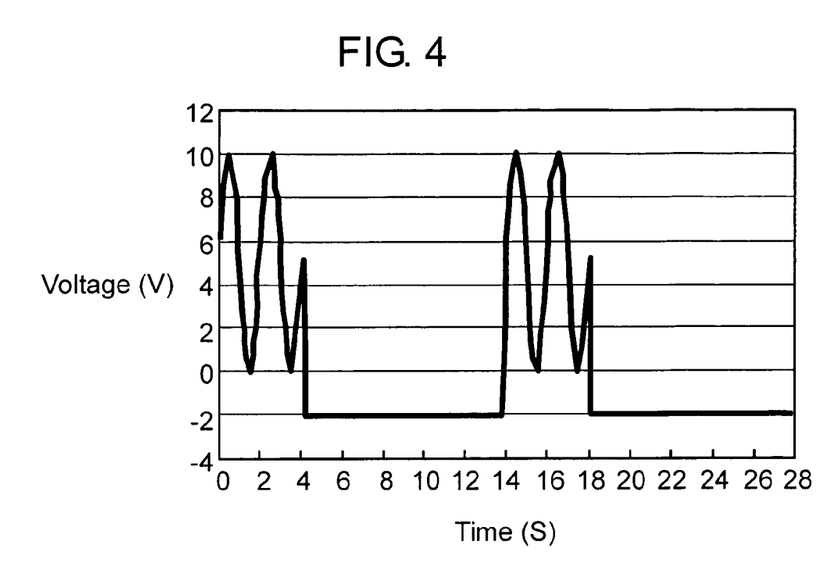
FIG. 4 is a diagram showing a voltage waveform of the voltage for position control and reverse low voltage applied to the piezoelectric actuator in accordance with the exemplary embodiment.

Position control device 10 is operated at a temperature of 80° C. and a humidity of 80% to perform an accelerated reliability test. The voltage waveform of power supply 14 at this time is shown in FIG. 4. FIG. 4 shows a voltage waveform of the voltage and reverse low voltage for position control applied to piezoelectric actuator 12. The vertical axis shows voltage V (V), and the horizontal axis shows time t (s). In FIG. 4, the sine wave part is a time zone of the position control. The time period over which voltage V is −2V and constant corresponds to the standby state, and is a time zone where reverse low voltage control unit 24 operates to apply reverse low voltage to piezoelectric actuator 12. This operation is continued for 1000 hours, but no reduction in insulation resistance of piezoelectric actuator 12 is found.

Figure 5:
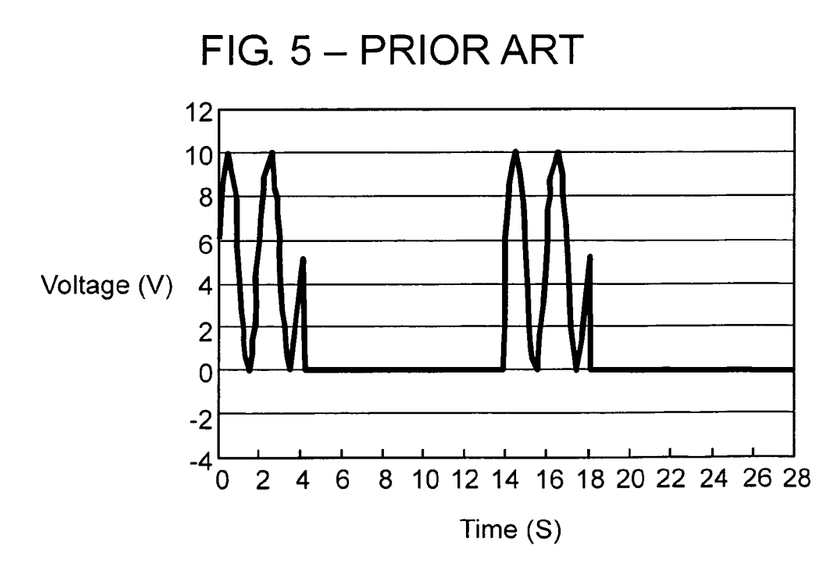
FIG. 5 is a diagram showing a voltage waveform obtained when the voltage for position control is the same as that in FIG. 4 and reverse low voltage is not applied in order to perform comparison in accordance with the exemplary embodiment.

For purposes of comparison, the operation of reverse low voltage control unit 24 as a characteristic of the present invention is stopped, and a similar examination is performed in the case having no reverse low voltage. FIG. 5 shows the voltage waveform of power supply 14 at this time. For purposes of comparison with the case of FIG. 4, FIG. 5 shows voltage for position control that is similar to that of FIG. 4 and has the voltage waveform of the case having no reverse low voltage. The vertical axis shows voltage V (V), and the horizontal axis shows time t (s). In FIG. 5, the sine wave part is a time zone of no position control. In the standby state, reverse low voltage control unit 24 is not operated, so that voltage is not applied to piezoelectric actuator 12. After the operation is continued for 1000 hours, the insulation resistance of piezoelectric actuator 12 is measured. As a result, short circuit occurs between first electrode film 3 and second electrode film 4, and a function as piezoelectric actuator 12 is lost.

According to the above-mentioned result, a large displacement amount of piezoelectric actuator 12 is maintained and the lifetime thereof can be elongated in the control method of the piezoelectric actuator of the present embodiment.

A constant voltage of −2 V is applied as the reverse low voltage in the present embodiment; however, the present invention is not limited to this. For example, the stored contents in application history storage unit 22 may be used, or a detector may detect the value of current flowing through piezoelectric actuator 12 and reverse low voltage control unit 24 may determine a power supply control signal using the current value information. The current value is determined by measuring the insulation resistance as one of the physical properties of piezoelectric actuator 12, and it is preferable to measure the insulation resistance when not alternating voltage but direct voltage is applied to piezoelectric actuator 12. Based on the current value and the voltage applied to piezoelectric actuator 12 at this time, the insulation resistance of piezoelectric actuator 12 can be determined. When it is detected that the insulation resistance varies from a set value by a certain value, reverse low voltage control unit 24 transmits a power supply control signal of the size corresponding to the variation.

Specifically, a detector for detecting the value of current flowing through piezoelectric actuator 12 and a variation calculating unit for calculating that the current value varies from the initial value by a set value are previously disposed. The control unit transmits a power supply control signal of the size corresponding to the variation from reverse low voltage control unit 24 based on the variation information from the variation calculating unit.

This allows the recovery corresponding to the actual reduction in resistance of piezoelectric actuator 12. The monitoring of the current value also allows measurement of the reduction in insulation resistance caused when the reverse low voltage is applied excessively. When the insulation resistance is reduced, the transmission of the power supply control signal from reverse low voltage control unit 24 is stopped.

The reverse low voltage and set time set based on the application history information may be set in response to the duration of the position control state, the time integration value of the voltage, and the time integration value of the function of voltage. The position control state means a state where voltage for controlling the position is applied to the piezoelectric actuator. The voltage may be applied while at least one of the reverse low voltage and set time is controlled. For example, the reverse low voltage may be not a constant voltage shown in FIG. 4 but a voltage varying over time.

Piezoelectric film 2 of the present embodiment is preferably formed by one of the sputtering method, a laser ablation method, a sol-gel method, a chemical vapor deposition (CVD) method, and a plasma chemical vapor deposition (PCVD) method. Piezoelectric film 2 formed by that method is denser than a piezoelectric substance formed by a sintering method. The withstand voltage can thus be increased, so that larger voltage can be applied to the positive side in the graph of FIG. 3. As a result, a larger displacement amount can be realized. However, the voltage characteristic curve is deflected to be more on the positive side. The reduction in insulation resistance following the application therefore becomes more severe. The control method of the present invention more effectively acts on piezoelectric film 2, and the reduction in insulation resistance can be remarkably recovered or suppressed.

An applying example of the position control device of the present embodiment to a fine movement position control of the head of the disk device is described hereinafter.

Figure 6:
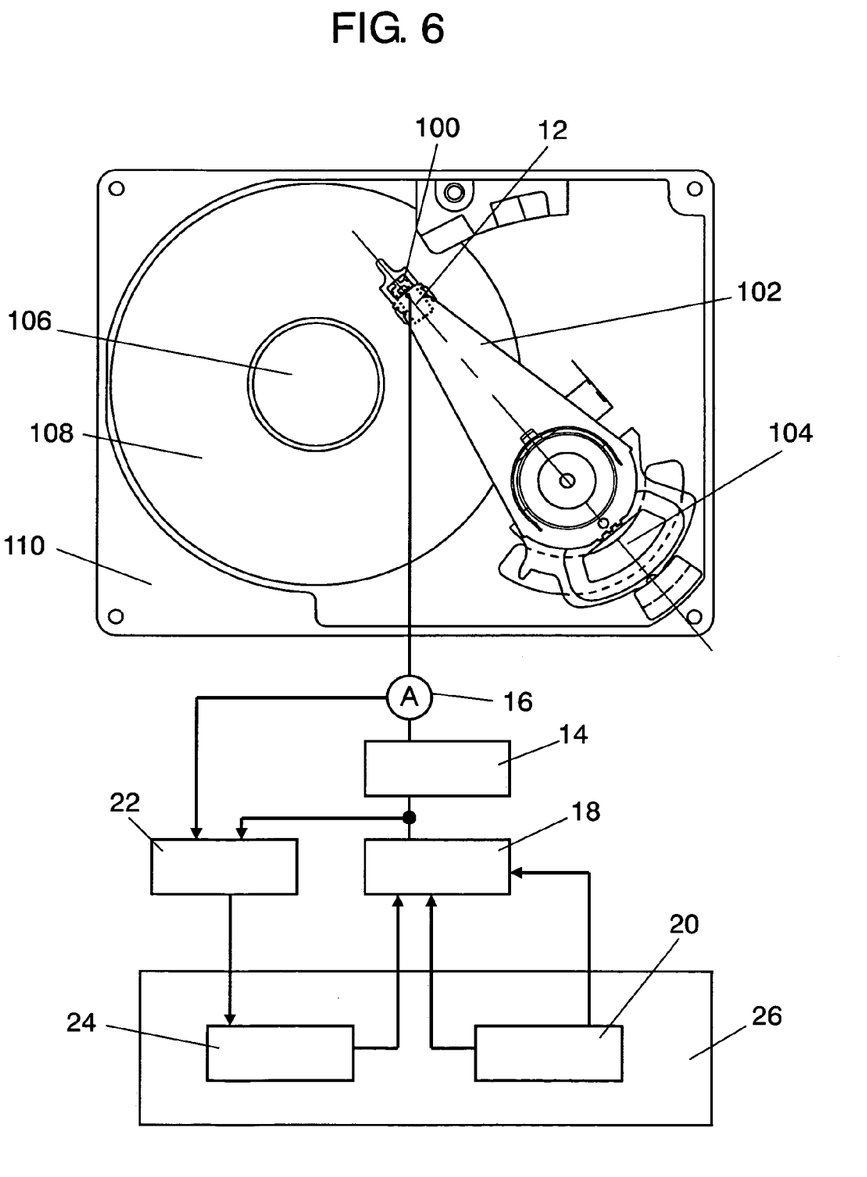
FIG. 6 is a plan view of a hard disk drive (HDD) device employing the position control device of the exemplary embodiment, and a block diagram of the position control device.

FIG. 6 is a plan view of a hard disk drive device (hereinafter referred to as "HDD device") and a block diagram of a position control device. The HDD device has the following elements:

disk 108 for recording information;
driving means 106 for rotating and driving disk 108;
head 100 for performing record reproduction;
suspension 102 that is mounted with head 100 and swings on disk 108; and
piezoelectric actuator 12 that is mounted near voice coil 104 for roughly driving suspension 102 and head 100.

These elements are disposed at predetermined positions of casing 110.

The displacement of piezoelectric actuator 12 allows head 100 to be precisely and finely adjusted to a target track position of disk 108. The position control device has a configuration the same as that of FIG. 1, and hence detailed descriptions are omitted.

A specific operation for controlling the head position of the HDD device is described hereinafter. When the HDD device records and reproduces information, position control unit 20 outputs a state identification signal to switch 18, and power supply 14 is controlled by position control unit 20. In response to this operation, position control unit 20 outputs a power supply control signal to power supply 14 via switch 18, and controls the position of head 100 so that head 100 lies at a predetermined track position on disk 108. At this time, application history storage unit 22 stores the application history information of the power supply control signal.

After that, when the HDD device transfers to the idling state where recording or reproduction is not performed, precise position control of head 100 is not required. At this time, position control unit 20 transmits a state identification signal indicating the standby state to switch 18. Power supply 14 thus transfers from a state controlled by position control unit 20 to a state controlled by reverse low voltage control unit 24. At this time, reverse low voltage control unit 24 refers to the application history information in application history storage unit 22, and calculates the deflection degree of the polarity of the voltage applied to piezoelectric actuator 12 for the past certain time period.

The calculating method may use the time integration value of voltage in the past predetermined time interval, or a function of voltage such as the time integration value of the third power of voltage, for example. Here, the function of voltage is used for the following reason. In other words, as the voltage increases, the movement of ions in piezoelectric actuator 12 is promoted exponentially. By using a quadratic or higher function or exponential function of voltage rather than a simple time integration value of voltage, more effective reverse low voltage and set time can be calculated.

Based on the calculation result, reverse low voltage control unit 24 transmits a power supply control signal so that power supply 14 generates voltage equivalent to the electric field in the direction opposite to the initial polarization direction of piezoelectric actuator 12. However, the absolute value of the reverse low voltage to be applied is set at or below a coercive voltage of piezoelectric actuator 12 so that the polarization state is not disturbed. More preferably, the absolute value of the reverse low voltage is set at or below ⅓ of the coercive voltage.

The magnitude of the reverse low voltage and the set time during which the reverse low voltage is applied are determined based on the evaluation of the application history information. In other words, the voltage applied to piezoelectric actuator 12 for the past certain time is deflected in the polarization direction, the reverse low voltage is increased or the set time is extended in response to the degree of the deflection. This can prevent the phenomenon in which reverse low voltage control unit 24 excessively applies reverse voltage to piezoelectric actuator 12 to reduce the insulation resistance contrarily.

When the HDD device transfers to the busy state of recording and reproduction again even while reverse low voltage control unit 24 generates the power supply control signal, position control unit 20 may transmit the state identification signal indicating the position control state to switch 18. Power supply 14 thus transfers from the state controlled by reverse low voltage control unit 24 to the state controlled by position control unit 20. In response to this, the position control device transfers from the standby state to the position control state. In this case, the operation of applying the reverse low voltage by reverse low voltage control unit 24 is suspended halfway. When the position control device comes into the standby state again, however, the applying operation of the reverse low voltage can be restarted based on the application history information.

When the HDD device continues the normal recording and reproduction, reverse low voltage control unit 24 cannot operate and hence the reverse low voltage cannot be applied. However, the disk device including the HDD device does not continuously and steadily perform the recording and reproduction, but is mainly intermittently used. Therefore, the control method of the present invention effectively acts on a majority of disk devices.

The control method of the piezoelectric actuator of the present invention can enlarge the control range of the position control device and can realize a long lifetime. The piezoelectric actuator is useful in a disk device field requiring precise positioning control of the head.

What is claimed is:

1. A control method for controlling a piezoelectric actuator, wherein
   the piezoelectric actuator comprises a pair of electrode films and a piezoelectric film sandwiched between the electrode films,
   the piezoelectric actuator lies in a position control state in which position control is performed by generating a displacement amount that is set by application of voltage or a standby state that does not require the position control, and
   in the standby state, reverse low voltage that is directed opposite to the polarization direction of the piezoelectric film, and is lower than a coercive voltage, is applied to the piezoelectric actuator for a set time.

2. The control method according to claim 1,
   wherein in at least one of the position control state and the standby state, when a physical property of the piezoelectric actuator is measured and shift of the physical property from a set value is detected, the reverse low voltage is applied for the set time in the standby state.

3. The control method according to claim 2,
   wherein the physical property is an electric resistance of the piezoelectric actuator.

4. The control method according to claim 1,
   wherein application history information of voltage for performing the position control to the piezoelectric actuator is stored, the reverse low voltage and the set time are set based on the application history information, and the set reverse low voltage and set time are applied to the piezoelectric actuator in the standby state.

5. The control method according to claim 4,
   wherein the reverse low voltage and the set time to be set based on the application history information are set in response to a duration of the position control state in which the voltage for performing the position control is applied to the piezoelectric actuator.

6. The control method according to claim 4,
   wherein the reverse low voltage and the set time to be set based on the application history information are set in response to a time integration value of the voltage that is applied for performing the position control to the piezoelectric actuator.

7. The control method according to claim 4,
   wherein the reverse low voltage and the set time to be set based on the application history information are set in response to a time integration value of a function of the voltage that is applied for performing the position control to the piezoelectric actuator and a time during which the voltage is applied.

8. The control method according to claim 4,
   wherein at least one of the reverse low voltage and the set time is controlled while being applied.

9. The control method according to claim 1,
   wherein the piezoelectric film is formed by a vapor deposition process or a sol-gel process, and the polarization direction of the piezoelectric film is the film thickness direction.

10. The control method according to claim 9,
    wherein as the vapor deposition process, one of a sputtering method, a laser ablation method, a chemical vapor deposition (CVD) method, and a plasma chemical vapor deposition (PCVD) method is used.

11. A position control device comprising:
    a piezoelectric actuator including a pair of electrode films and a piezoelectric film sandwiched between the electrode films;
    a power supply for applying voltage to the piezoelectric actuator;
    a position control unit for identifying a position control state in which position control is performed by displacing the piezoelectric actuator and a standby state that does not require the position control and for controlling the position; and
    a reverse low voltage control unit that, when the position control unit identifies the standby state of the piezoelectric actuator, sets a reverse low voltage that is directed opposite to a polarization direction of the piezoelectric film and is lower than a coercive voltage and a set time during which the reverse low voltage is applied, and transmits a power supply control signal to generate the set reverse low voltage for the set time to the power supply.

12. The position control device according to claim 11, further comprising:
    a detecting unit for detecting a current flowing through the piezoelectric actuator; and
    a variation calculating unit for calculating variation of the current from an initial value by a set value,
    wherein the reverse low voltage control unit sets the reverse low voltage and set time based on variation information from the variation calculating unit and determination information of the standby state by the position control unit, and transmits the power supply control signal.

13. The position control device according to claim 11, further comprising an application history storage unit for storing a history of the power supply control signal,
    wherein the reverse low voltage control unit sets the reverse low voltage and the set time to be applied to the piezoelectric actuator based on the information stored in the application history storage unit.

14. The position control device according to claim 13,
    wherein the reverse low voltage control unit calculates duration of the position control state based on the information stored in the application history storage unit, sets the reverse low voltage and the set time in response to the calculated duration, and transmits the power supply control signal to generate the reverse low voltage for the set time to the power supply.

15. The position control device according to claim 13, wherein the reverse low voltage control unit calculates a time integration value of the voltage applied to the piezoelectric actuator based on the information stored in the application history storage unit, sets the reverse low voltage and the set time in response to the time integration value, and transmits a power supply control signal to generate the reverse low voltage for the set time to the power supply.

16. The position control device according to claim 13, wherein the reverse low voltage control unit calculates a time integration value of a function of the voltage that is applied to the piezoelectric actuator and a time during which the voltage is applied, sets the reverse low voltage and the set time in response to the time integration value of the function, and transmits the power supply control signal to generate the reverse low voltage for the set time to the power supply.

17. The position control device according to claim 11, wherein the piezoelectric film is formed by a vapor deposition process or a sol-gel process, and the polarization direction of the piezoelectric film is the film thickness direction.

18. The position control device according to claim 17, wherein as the vapor deposition process, one of a sputtering method, a laser ablation method, a chemical vapor deposition (CVD) method, and a plasma chemical vapor deposition (PCVD) method is used.

19. A disk device comprising:
a disk on which information can be recorded;
a head for performing at least one of recording and reproduction on the disk; and
a position control device for controlling a position of the head on the disk,
wherein the position control device includes:
a piezoelectric actuator formed of a pair of electrode films and a piezoelectric film sandwiched between the electrode films;
a power supply for applying voltage to the piezoelectric actuator;
a position control unit for identifying a position control state in which position control is performed by displacing the piezoelectric actuator and a standby state that does not require the position control, and for controlling the position; and
a reverse low voltage control unit that, when the position control unit identifies the standby state of the piezoelectric actuator, sets a reverse low voltage that is directed opposite to a polarization direction of the piezoelectric film and is lower than a coercive voltage and a set time during which the reverse low voltage is applied, and transmits a power supply control signal to generate the set reverse low voltage for the set time to the power supply,
wherein, in the position control state of the position control device, the head is performing one of the recording and reproduction on the disk, and, in the standby state, the head is performing none of the recording and reproduction on the disk.

* * * * *